United States Patent [19]

LeMaire et al.

[11] Patent Number: 5,134,773
[45] Date of Patent: Aug. 4, 1992

[54] METHOD FOR MAKING A CREDIT CARD CONTAINING A MICROPROCESSOR CHIP

[76] Inventors: Gerard LeMaire, 26, Bd. Jean Jaures; Philippe LeMaire, Av. Armee Patton, both of Nancy, France, 54000

[21] Appl. No.: 527,184

[22] Filed: May 22, 1990

[30] Foreign Application Priority Data

May 26, 1989 [FR] France .................. 89 06908
Mar. 2, 1990 [FR] France .................. 90 02624

[51] Int. Cl.⁵ .................................. H01R 43/00
[52] U.S. Cl. ............................ 29/827; 174/52.2; 437/209; 437/211; 437/217
[58] Field of Search ............ 437/217, 211, 209; 29/827, 845; 174/52.2

[56] References Cited

U.S. PATENT DOCUMENTS

| | | | |
|---|---|---|---|
| 3,754,070 | 8/1973 | Dunn et al. | 437/211 X |
| 4,250,347 | 2/1981 | Fierkens | 437/217 X |
| 4,641,418 | 2/1987 | Meddles | 437/217 |
| 4,674,175 | 6/1987 | Stampfli | 437/209 |
| 4,766,095 | 8/1988 | Hiroshi | 174/52.2 X |
| 4,769,344 | 9/1988 | Sakai et al. | 437/211 X |
| 4,857,483 | 8/1989 | Steffen et al. | 437/209 |

FOREIGN PATENT DOCUMENTS

| | | |
|---|---|---|
| 107938 | 10/1986 | European Pat. Off. . |
| 0340100 | 2/1989 | European Pat. Off. . |
| 57-17138 | 1/1982 | Japan ............ 437/211 |
| 60-76130 | 4/1985 | Japan ............ 437/211 |
| 62-90213 | 4/1987 | Japan . |

Primary Examiner—Carl J. Arbes
Attorney, Agent, or Firm—Darby & Darby

[57] ABSTRACT

According to the invention, the electronic module (1) which is to be contained in the card is formed by producing the electronic circuit out of a metal strip (19) which is pre-cut and pre-formed in order to present contact members (10), the electronic chip being then soldered and wired to said strip; the said electronic module (1) is then coated with resin forming a resin block (14), and during the moulding of the card, a pressure P is applied to the mould (103) for firmly clamping the electronic module (1) between the mold shells and for securing it within positioning and blocking means as well as for pressing its contact members (10) against the inner wall of the mould.

32 Claims, 11 Drawing Sheets

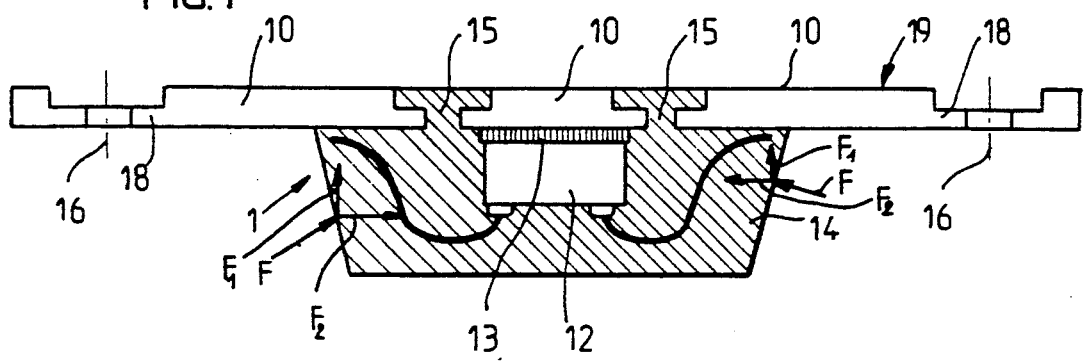
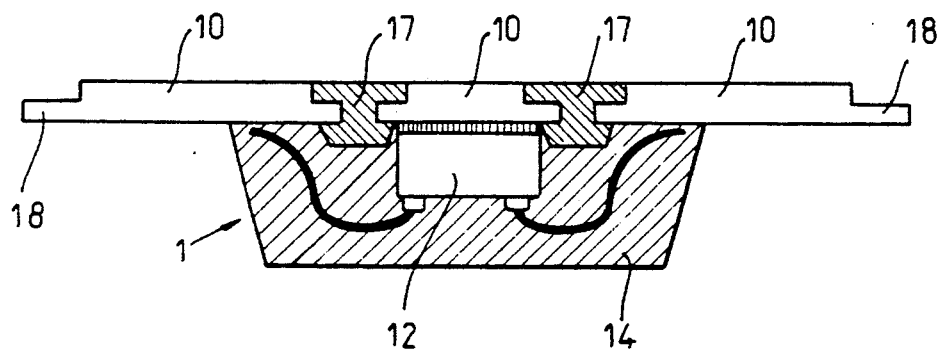
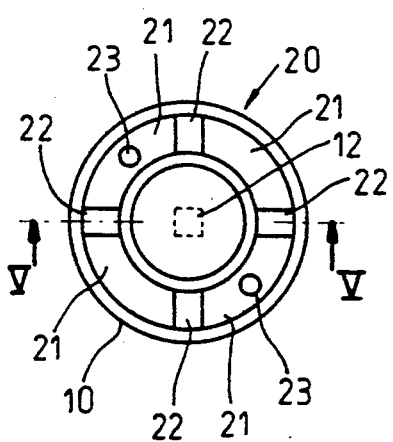
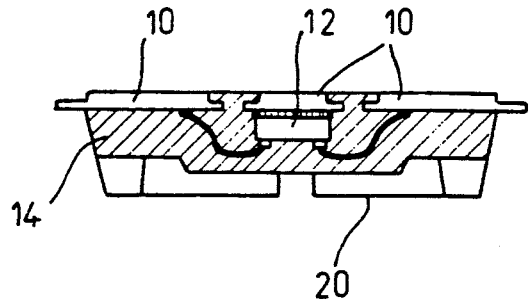

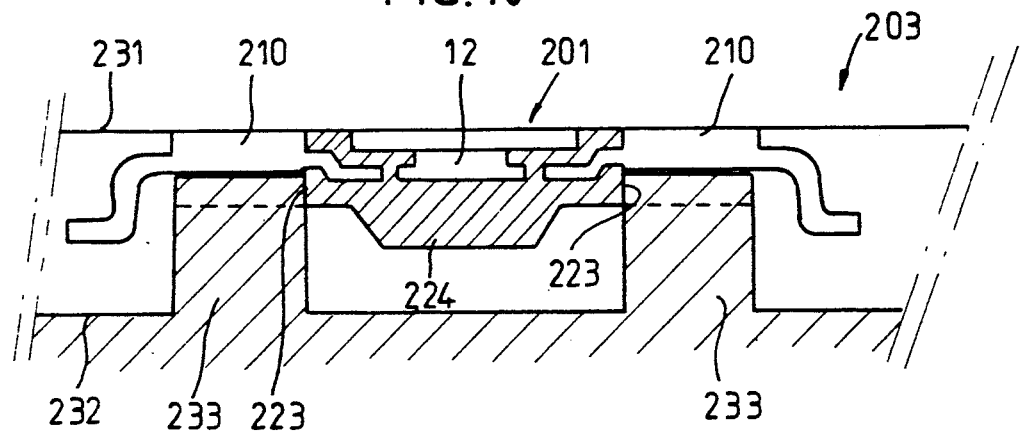
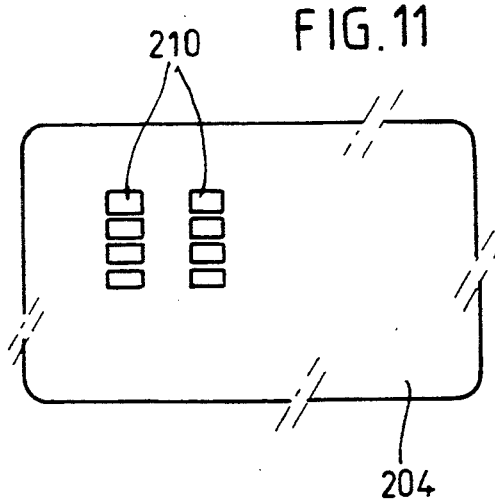
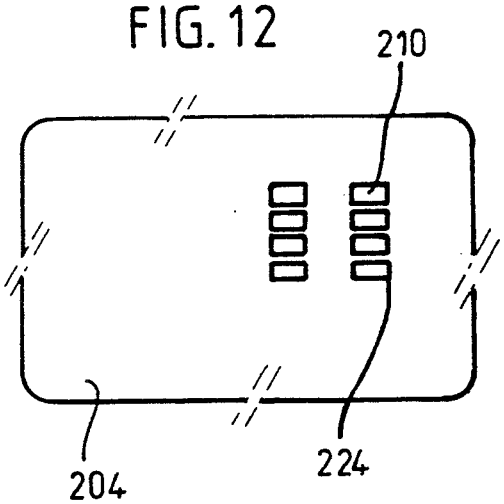

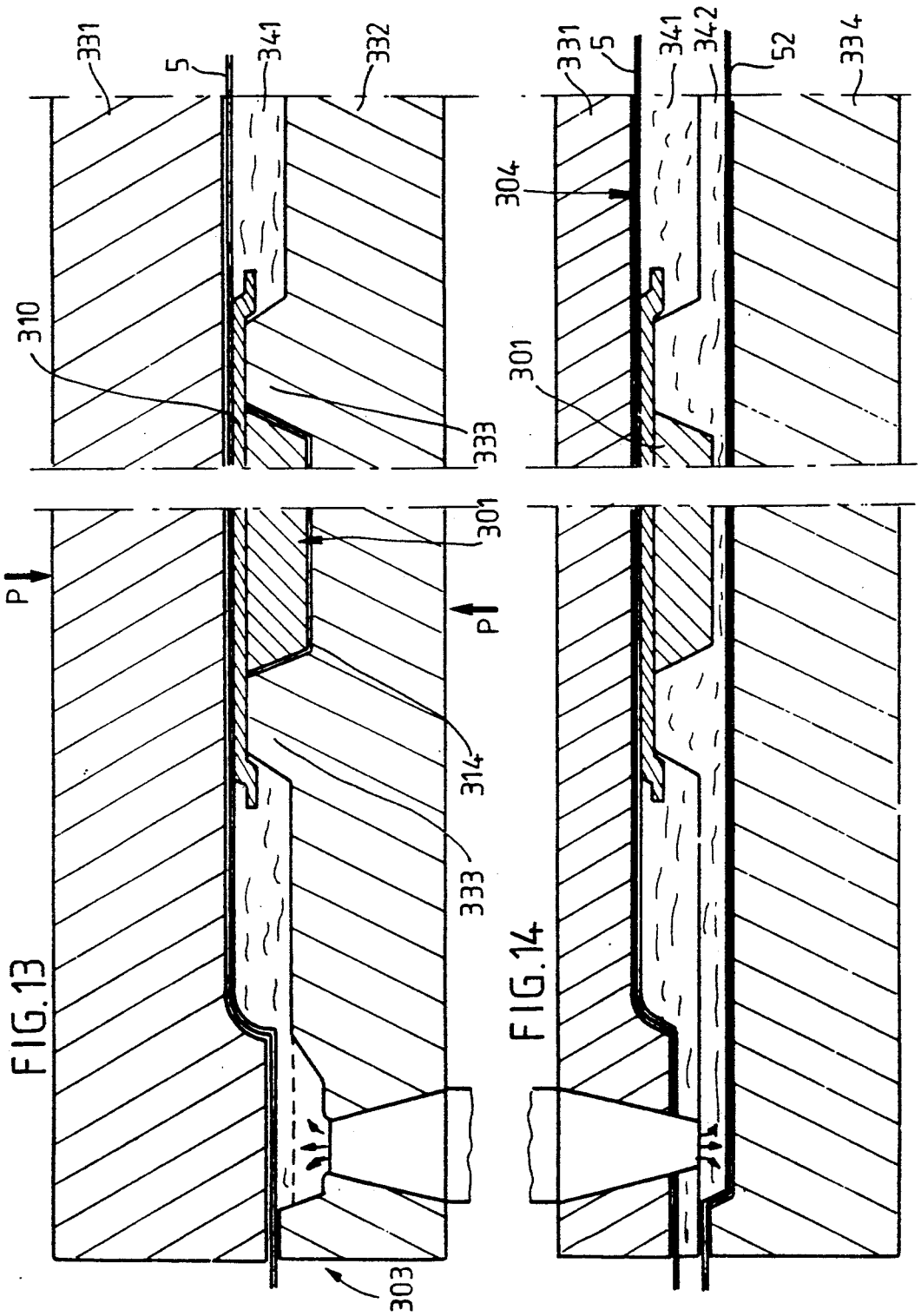

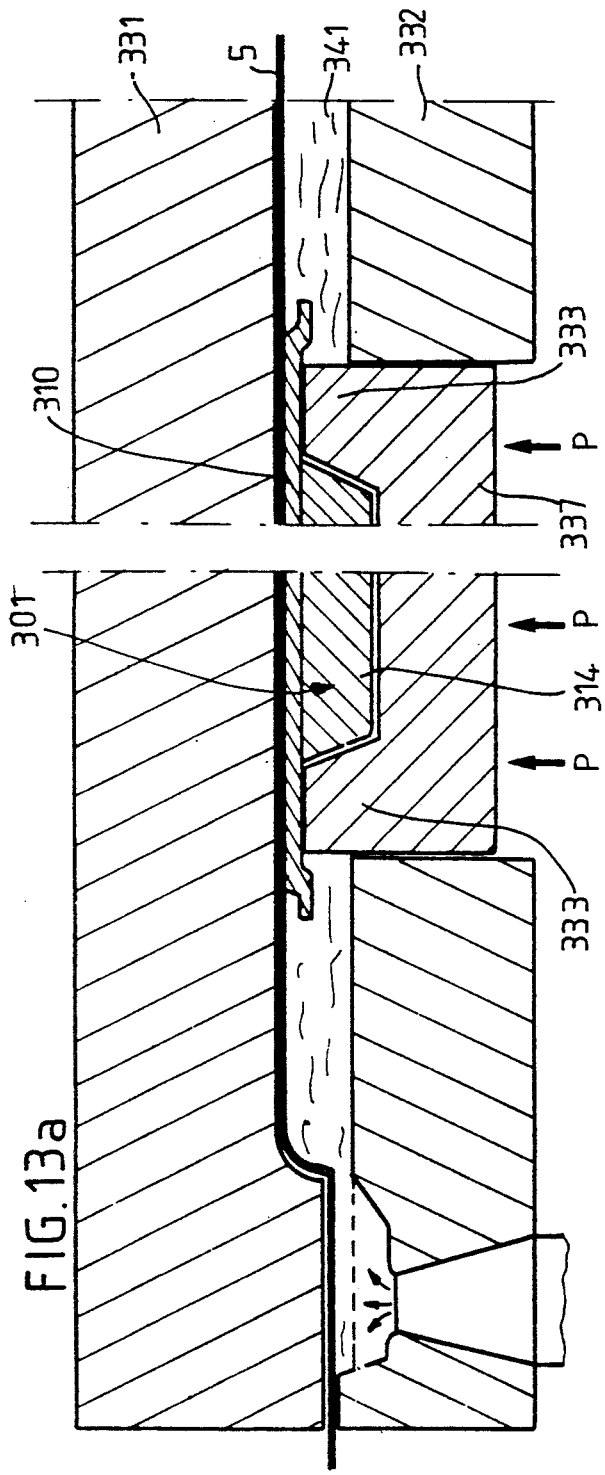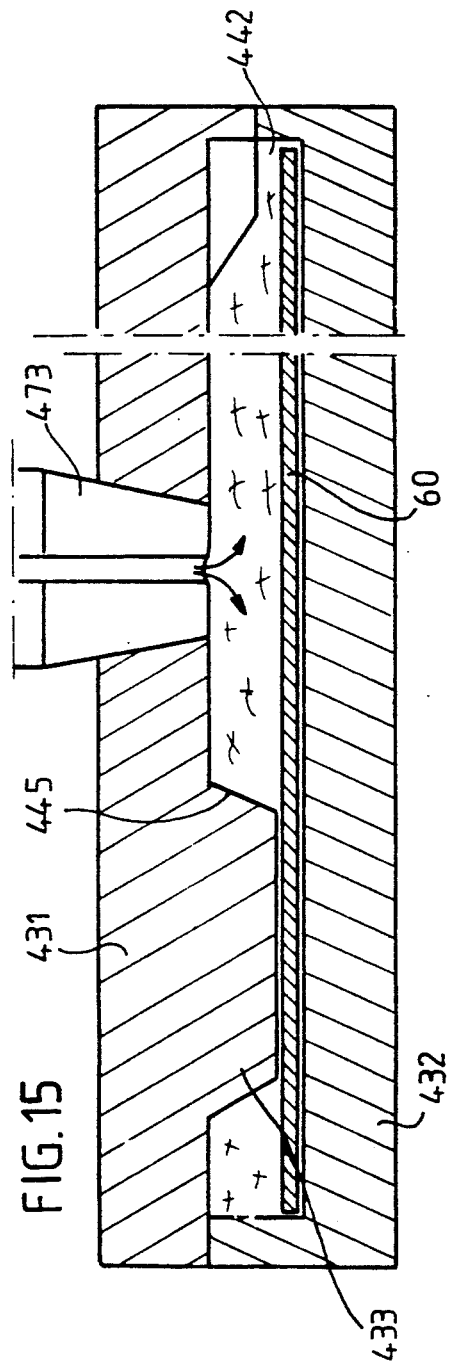

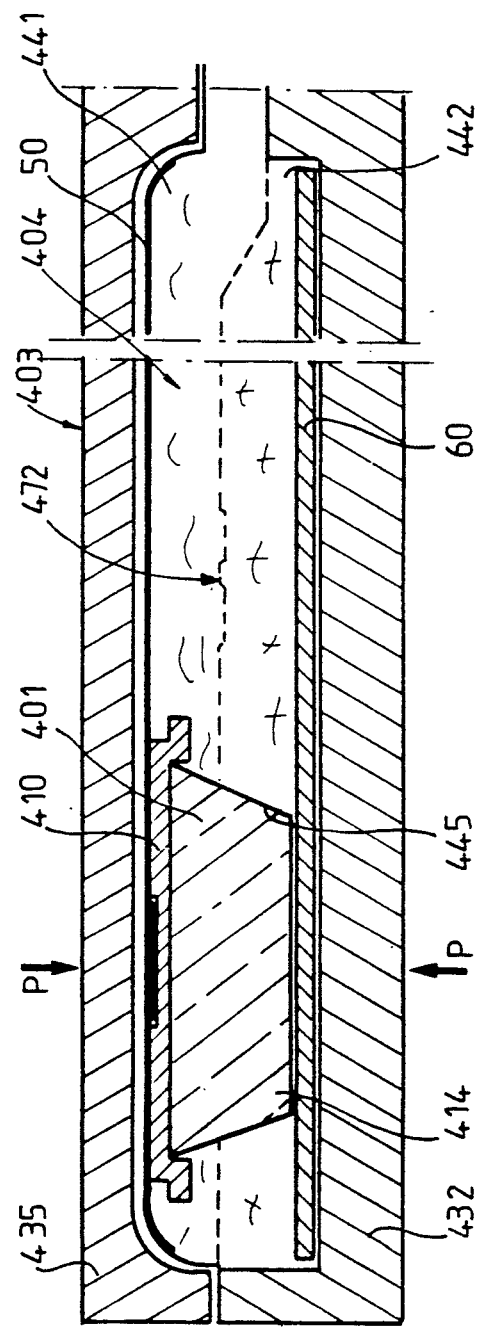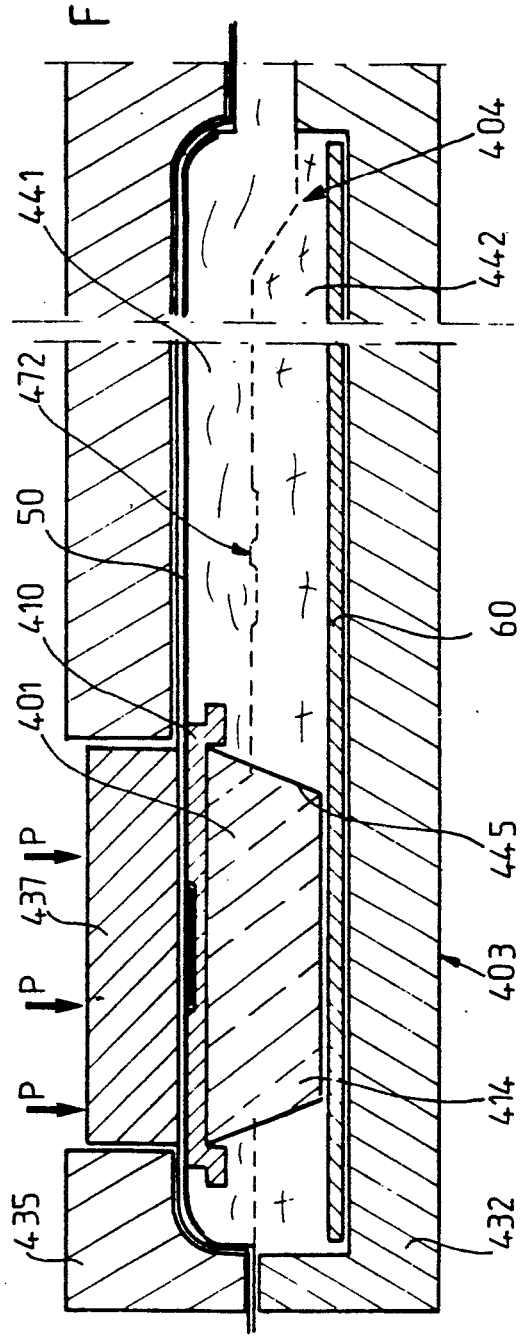

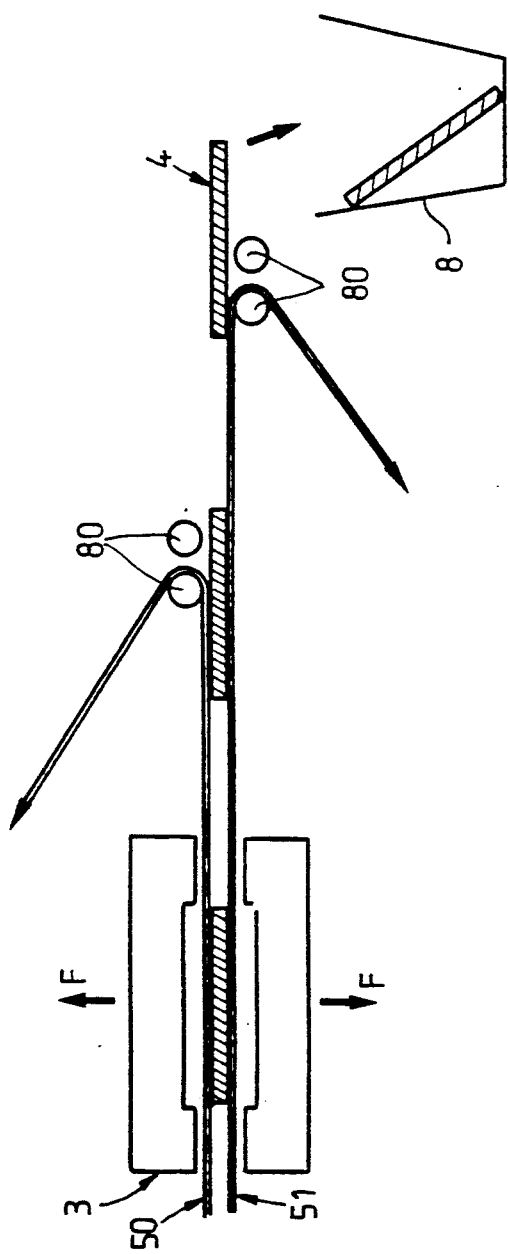
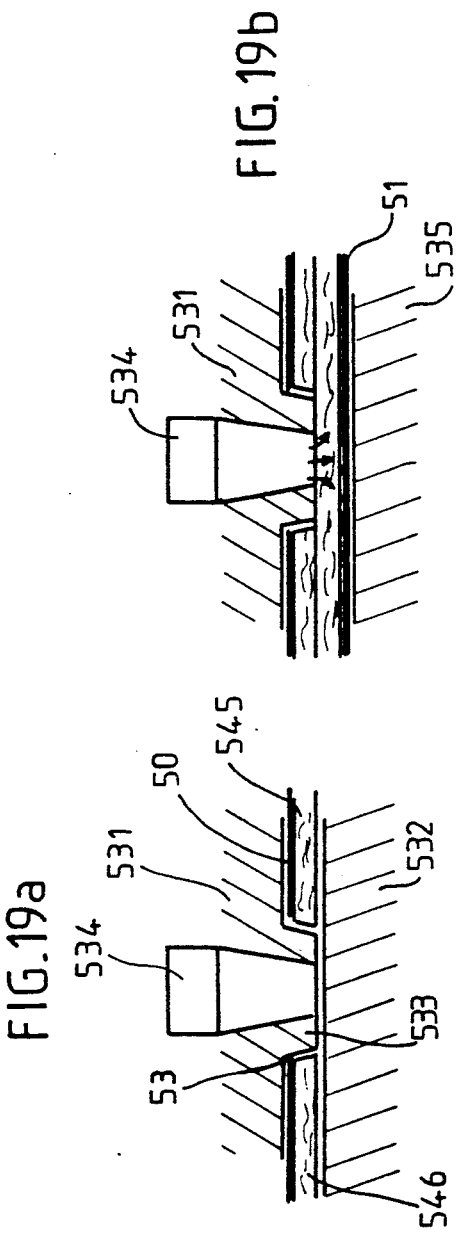

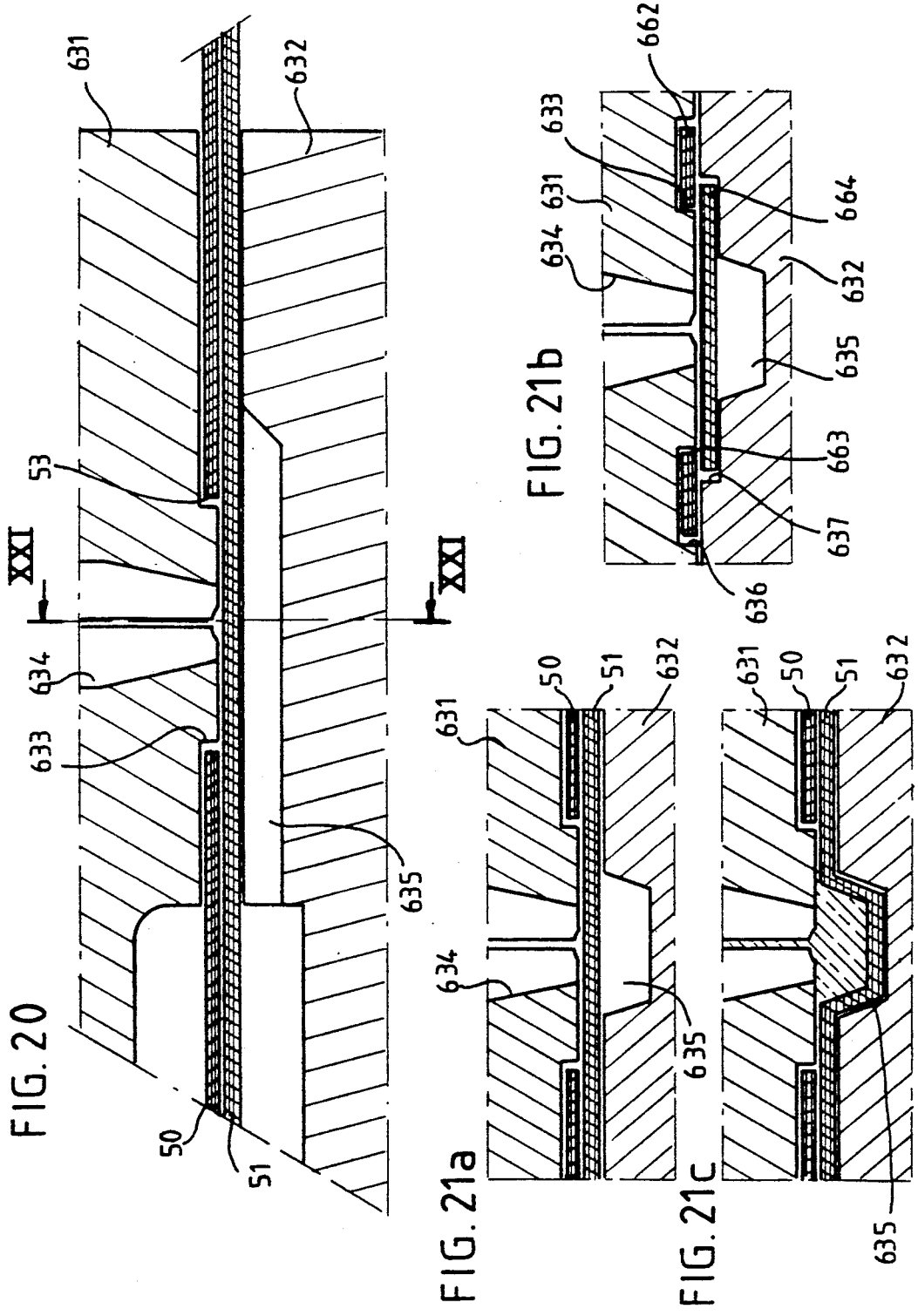

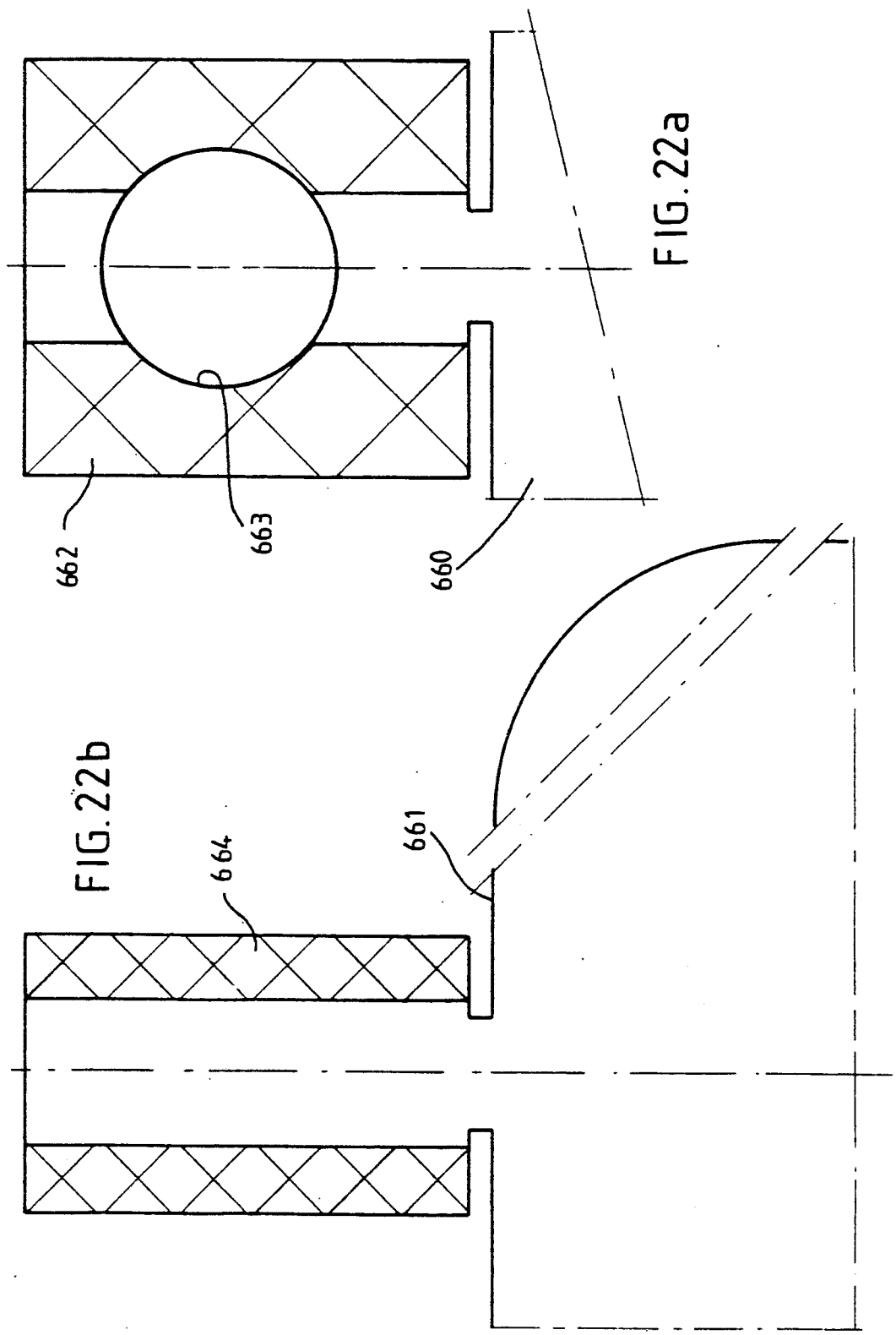

METHOD FOR MAKING A CREDIT CARD CONTAINING A MICROPROCESSOR CHIP

FIELD OF THE INVENTION

This invention relates to a method for manufacturing credit cards and the like, containing a microprocessor chip, as well as to credit cards and the like produced in accordance with the said manufacturing method.

These cards which have been devised recently are mainly credit cards containing an electronic module using a highly performing electronic component known as an electronic chip.

The main problem arising in the design of such "chip cards" relates to the positioning and fixation of the electronic module in the plastic card.

PRIOR ART

At present, most chip cards are manufactured by cutting out at first the plastic card from a board or by moulding this card from plastic material.

This plastic card is shaped with a recess within which the electronic module will be positioned and glued in place.

The document EP 0 254 640 describes a method of this kind for producing chip cards. In this document, there is provided, according to a first embodiment, the formation of a cavity which opens into both faces of the plastic card, the electronic module being then positioned with its contact pieces flush with one face of the card, and the cavity being thereafter filled with glue for fixing said module. The module will then be protected to some extent by the glue, but there remains a risk that it may be subjected to external strains liable to impair its reliability.

In order to obtain a better protection of the electronic module, a second embodiment consists in forming a recess which opens into only one face of the card. The module will then not be accessible through the back of the card. However, this embodiment requires very complex operations, because every dimension must be strictly respected, since otherwise this would produce a card in which the contacts would not lie in the plane of the plastic card.

In order to overcome these drawbacks, it has been attempted to produce a chip card by moulding the card body around the electronic module. For this purpose, the electronic module is positioned in a mould into which will be injected the plastic material for forming the plastic card.

A method of this kind is described, for instance, in the Japanese document 59.73567 or in the European document 0 227 854.

These methods are not satisfactory because they do not completely ensure that the positioning of the electronic module in the mould will be safely preserved.

The Japanese document provides for positioning the module by inserting into a recess of the mould a tenon carried by the module. Using this method, it is not possible to achieve a good quality of the card, because the plastic material being injected at a pressure of about 700 kg/cm$^2$ displaces the module.

European Patent 0 277 854 attempts to improve this method by using a vacuum system for holding down the module during the plastic injection. This suction is moreover provided for holding down the contacts of the module against the internal face of the mould.

This arrangement is not very effective, since it is difficult to obtain by means of a vacuum pump that the module will be maintained in place against the pressure exerted by the plastic material being injected.

This European Patent provides a second arrangement in which the electronic module is maintained by a plate supported by springs. In this arrangement, it is provided that during the moulding process the plastic will first surround the module before pushing down the said plate against the springs in order to completely fill the cavity of the mould.

This is completely unrealistic, since the pressurized plastic will act upon the plate from the very start of the injection process, so that the module will no longer be kept in place. These arrangements do not make it possible to obtain cards in which the module is perfectly positioned and, moreover, the plastic seeps in between the contacts and the wall of the mould, thus soiling the contacts and making it necessary to provide a cleaning operation for cleaning these contacts. Obviously, this cleaning adds considerably to the production cost of the card.

The module described and used in this Patent is formed from a board of insulating material, one face of which receives a metal overlay for forming the contacts.

On the opposite face, the electronic chip will be fixed and wired, and then coated with resin. A module of this type is difficult to use because the resin does not adhere properly to the insulating material board. Also, the plastic used for forming the card body does not adhere properly to the board.

As a result, if a chip card made with such a module becomes folded, the insulating material board is separated from the plastic card and even from the resin, so that the card becomes completely unusable.

On another hand it is also stated, in this same European Patent 0 277 854, that for obtaining a proper anchoring of the module in the molded plastic, the resin coating must be given a dovetail shape. It has however been found that this disposition is very unfavorable. In fact, this dovetail shape defines a wedge-shaped volume into which the plastic material will flow during the injection process; due to the high injection pressure, the plastic material will then exert forces tending to separate the metal strip from the assembly formed of the electronic component and its coating. It is then impossible to rely, as in EP 0 277 854, on the shape given to the resin coating for fastening the module in the plastic card, and it is indeed preferable to avoid giving to the resin coating the shape described in this Patent, and much rather to give it an inverted shape, so that the forces exerted on the resin coating by the plastic material injected at a high pressure may tend to press this coating against the metal strip.

The present invention aims at overcoming these various drawbacks by providing a manufacturing method by which chip cards may be produced at a production cost which is considerably less than the present cost, and by which perfect cards may be obtained.

BRIEF DESCRIPTION OF THE INVENTION

Towards this purpose, the invention provides a manufacturing method for the production of a chip card comprising an electronic module having contact pieces arranged within a plastic card, during which method the card is moulded in a mould inside which the electronic module is positioned in such manner that its rear face and its periphery are embedded in the plastic material from which the card is formed, characterized in that the electronic module is formed by producing the electronic circuit in a precut and preformed metal strip so that this strip presents contact members, the electronic microchip being soldered and wired onto said strip, said electronic circuit being subsequently provided with a resin coating, said method being further characterized in that a pressure P is applied to the mould so as to clamp the electronic module firmly between the half-shells of said mould and to ensure that this module will be kept in positioning and blocking means and that its contact members will be firmly pressed against the inner wall of the mould.

In order to make the clamping possible, the electronic module and the positioning means provided in the mould have such dimensions that their total height will equal the height of the mould cavity.

Using an electronic module produced from a metal strip has the advantage that it makes it possible to use means capable of ensuring a proper adhesion between the resin and the metal strip as well as between the plastic material and the module.

For achieving this purpose:

perforations are made in the metal strip for ensuring a good fastening of the resin;

the metal strip is formed with a bent edge, relatively to the contact members;

the edge is curved for forming this bent edge.

In cases where the shapes given to the contact members would render this manufacturing operation difficult, the present invention provides the step of forming small resin knobs on the metal strip for ensuring a proper mechanical holding of the whole set of contact members, before gluing and wiring the electronic microchip and proceeding with the resin coating operation.

In order to avoid a separation of the metal strip from the resin coating which surrounds the electronic module, this resin coating will preferably be given a beveled shape, this shape being such that the forces exerted thereon by the plastic material being injected will tend to press the module against the metal strip carrying the contact members.

A further object of this invention is to provide an economical solution to the problem of decorating microchip cards.

In above-mentioned EP 0 277 854, the microchip cards are completely manufactured before being decorated.

It is currently admitted that, when using conventional printing methods, losses amounting up to 10% will usually be recorded for the printing of an image. These losses are due to a faulty positioning of the image on the card which is to be decorated, and also to a poor quality of the image itself.

When printing chip cards after they have been manufactured, up to 10% of them are destroyed as a result of printing one face, or up to 20% if both faces have to be decorated. This destruction causes the loss of the electronic module contained in the cards, bringing about a heavy loss of money, since this module is formed of the metal strip, the electronic component with its connection wires which are often made of gold, the glue and the epoxy coating, the cost of all of which is far from negligible. It can be said that, by way of example, the module of a card such as those used in telephone booths, containing a simple electronic component, has a production cost of about 1.50 FFranc, while the finished card is sold at about 5 FFr. The loss is even heavier with bank cards which sell at about 50 FFr. and contain a module which comprises a microprocessor, the value of which, alone, is about 40 FFr.

This is why it is provided, in accordance with this invention, that the card will be decorated while it is being moulded, by means of an image-transfer film and/or a label placed in the mould. According to requirements, this decoration may be made on one or both faces of the card.

When carrying out, in accordance with this invention, the printing of an image or the fixing of a label at the time of moulding the card, the losses formerly due to the printing techniques are eliminated, since use is made of image-transfer films and labels, the quality of which is duly controlled. However, moulding the card with its decorative elements gives rise to problems which are mainly due to the dimensions of the moulding cavity.

By way of example, it can be said that the magnetic card, when completed, has a thickness of 840 microns, while the labels being used have a thickness which will generally range from 65 to 80 microns, and a transfer film with its support will be from 70 to 80 microns thick.

The card moulding operation does therefore require that the plastic material will properly fill a cavity having a depth of about 700 microns, but having an area of more than 40 cm$^2$.

A further problem relates to the keeping in place of the labels and films, since the plastic material being injected under very high pressure will tend to displace them.

This is why, in accordance with this invention, the method for moulding the card which is to be decorated on both faces provides that one of the image supports has an aperture which will be placed around a boss surrounding the injection nozzle of one of the half-shells, while the other image support will be positioned against the surface of the boss in front of the outlet of the injection nozzle, both image supports being held by clamping in a zone located around the boss, the plastic material being injected between the two supports which are thus pressed against the walls of the half-shells while the plastic material is filling the mould cavity.

In conventional methods, the placing of the labels after the card moulding operations requires a window to be cut out in advance in the label for the upper face of the card, while this window must present an outline matching very accurately the outline of the contacts which must appear on the surface of the card; thereafter, the label needs to be very precisely positioned, so that its cut-out window will register exactly with the outline of the contacts. This positioning operation is delicate and requires plenty of time.

On the contrary, the combined utilization of a transfer film put into place prior to the injection and of a metal strip for forming the contacts does away with the above-said delicate and costly operation, since it has been found that, while the image carried on the transfer film does adhere very well to the injected plastic, it does not adhere to the metal, so that, when the film is removed after the injection, the image cuts itself out in registry with the outline of the contacts. Moreover, the use of such a transfer film provides a simplification of its positioning with respect to the imprint of the mould, by providing a printed surface which is larger than the card. In fact, the printed portion resting against the shell of the mould does not stick to this shell.

According to a first embodiment of the invention:
the electronic module presents a crenellated skirt on its face opposed to the face which bears the contacts; apertures are provided in the skirt;
the mould presents small knobs around which the apertures of the module will be engaged until the end faces of the skirt portions rest on the bottom of the mould.

According to a second embodiment:
the electronic module presents apertures positioned under each one of the contacts;
the electronic module is positioned by the said apertures engaging small knobs provided on one of the mould shells.

The card obtained with either of these embodiments is remarkable in that it is possible to see through its back face, either the tips of the skirt portions of the electronic module, or else blind holes in the bottom of which the underside of the contacts may be seen.

Such cards are particularly interesting because the positioning of the electronic module is impeccable and because their production cost is considerably less than in prior art methods.

However, the presence of cavities in the back face of the cards may have drawbacks for certain types of utilization of the cards.

In fact, if the card has to carry solely an electronic module, as in the case of a card used for paying telephone calls, then these cavities will cause no trouble whatever. On the contrary, the cards made in accordance with the invention are highly interesting because of their low production cost which is compatible with the fact that these cards are discarded after use.

However, these cavities may be quite troublesome and undesirable when a card must carry magnetic strips in addition to the electronic module, as will often be required for credit cards issued by the banks. In fact, these magnetic strips are usually positioned on the back face of the card in such manner that they underly the contacts of the module present on the front face. Now, the presence of cavities under the magnetic strips may deform these, so that faults may occur in the data read-out or recording process.

A solution consisting in perforating the magnetic tape in registry with the cavities, taking care to place the perforations outside of the path followed by the read-out head, is not satisfactory, because the magnetic coating in this zone will no longer possess the required density.

This is why, according to a further embodiment of the invention, the card-moulding operation is made in two successive injections so that the card will carry no trace of the positioning means used for positioning the module in the mould.

This third embodiment of the invention will then consist in moulding over the electronic module in the first portion of the card, while the module is positioned on knobs of the mould. After this, the second part of the card will be molded over, and in this operation the cavities left by the knobs will be filled with plastic.

A fourth embodiment of the invention consists in moulding a first card portion comprising positioning means for the electronic module, and then moulding over the second portion after the module has been placed in said positioning means.

These third and fourth embodiments are advantageous since they make it possible, already at the time of the first injection, to position the injector nozzle at any desired point of the mould, since the imprint of this nozzle will be covered up during the second injection.

Advantageously, the magnetic strips which the card has to carry will be brought into place during one of the injections by means of a label carrying said strips and which will be placed in the bottom of the mould.

The cards being thus obtained have impeccable quality and a very low production cost.

The invention will be more readily understood and further features and advantages thereof will appear from the following description, with reference to the drawings in which:

FIG. 1 is a cross-sectional view of a first embodiment of the central portion of the electronic module;

FIG. 3 is a cross-sectional view of a second embodiment of the central portion of the electronic module;

FIG. 4 shows an embodiment of the electronic module, seen from underneath;

FIG. 5 is a cross-sectional view along line V—V of FIG. 4;

FIG. 10 is a cross-sectional view of a second installation for over-moulding;

FIG. 11 is a view of the top face of the card obtained with the installation of FIG. 10;

FIG. 12 is a view of the back face of the card of FIG. 11;

FIG. 13 shows the first phase of a third embodiment of the invention;

FIG. 13a is a modified embodiment of the device of FIG. 13;

FIG. 14 shows the second phase of the said third embodiment of the invention;

FIG. 15 shows the first phase of a fourth embodiment of the invention;

FIG. 16 shows the second phase of this fourth embodiment of the invention;

FIG. 16a is a modified embodiment of the device of FIG. 16;

FIG. 18 shows diagrammatically a manufacturing line for the production of microchip cards according to the invention;

FIGS. 19a and 19b show a detail of the mould being used;

FIG. 20 is a partial cross-section of a mould;

FIGS. 21a, 21b and 21c are cross-sectional views along line XXI—XXI of FIG. 20;

FIGS. 22a and 22b represent labels for decorating a card.

DETAILED DESCRIPTION OF THE INVENTION

Figure 2:
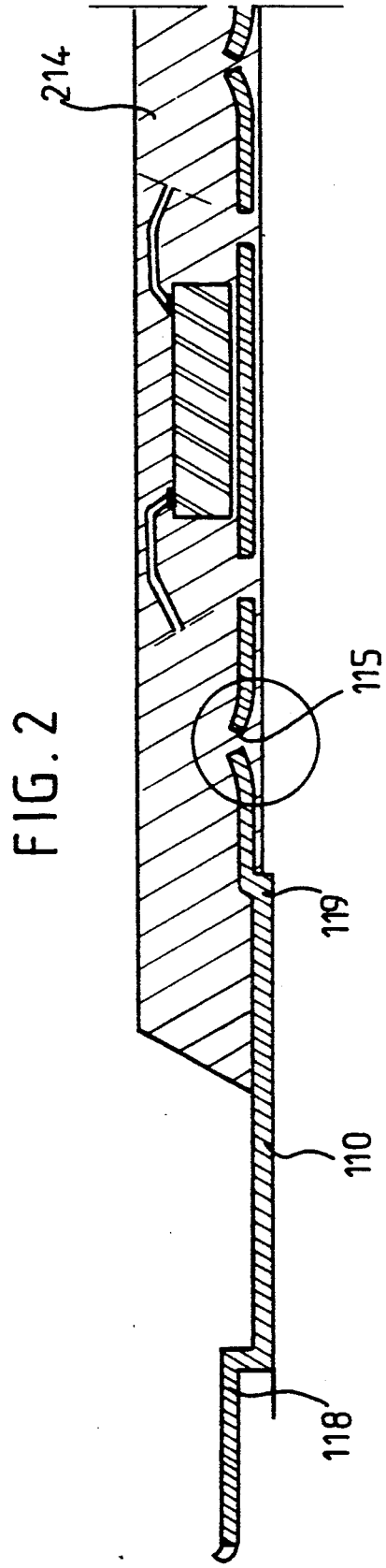
FIG. 2 is a partial view at a different scale.
Figure 2A:
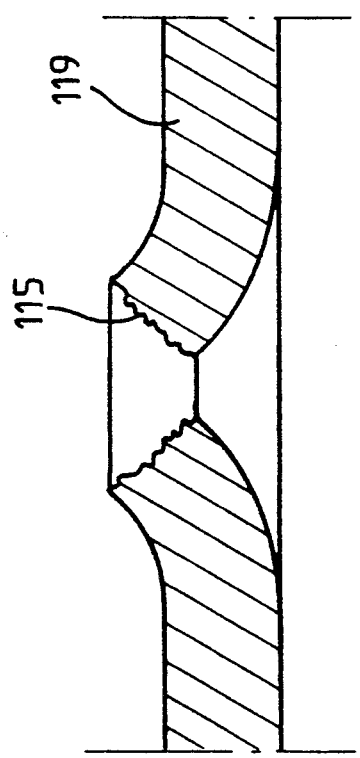
FIG. 2a shows a detail of FIG. 2.

The first step in the method according to this invention consists in producing the electronic module to be inserted in the card.

This step uses techniques for assembling electronic components which techniques are known for the production of plastic housings of the type used for encapsulating high-power components or microprocessors.

In this operation, use is made of a metal strip 19 which usually consists of copper, which is pre-cut and pre-formed so that the required contact members 10 may be formed by cutting sections of the strip. Usually, this strip will be made of copper or of silver-plated or gold-coated copper-beryllium alloy. On this strip, the electronic microchip 12 will be soldered, for instance by means of conductive glue 13, and the wiring will be done by thermo-bonding and/or ultrasonic soldering.

The electronic circuit having thus been prepared on each cut section of said strip 19 is coated with a resin 14 after having been positioned in a suitable mould. This resin coating 14 protects the microchip 12 effectively and prevents any damage to the wiring. The resin 14 being used is preferably of an electronic-grade type, which does not contain any substances like chlorine or phosphorus which would risk damage to the chip 12. Therefore, an epoxy resin or a silicone will preferably be selected.

However, for components which are not expected to last for a long time, such as in telephone cards, it will be possible, after protecting the chip with a varnish, to use an appropriate thermoplastic resin, thus lowering production costs and increasing the production rate, because thermoplastics are much easier to use.

As can be seen from FIG. 1, the resin 14 is allowed to fill the gaps 15 between the contact pieces 10 in order to fasten them mechanically and to insulate them electrically, while at the same time providing for the mechanical cohesion of the module. The gaps 15 are designed with a larger surface on the face opposite the chip 12 in order to achieve a perfect adhesion of the resin 14 with the metal strip 19.

The electronic module is then obtained by forming a cut 16 in the strip 19 so as to obtain a section carrying the contact members 10.

FIG. 2 shows a modified embodiment in which the metal strip 119 has only a small thickness. In this case, spaced perforations 115 are distributed over the strip for securing the fastening of the resin 114 with the metal strip 119.

One of the difficulties encountered in this operation relates to the need of keeping the surface of the contacts 10 outside the module 1 perfectly smooth and clean, in order that they will function satisfactorily when the card will be used. These difficulties are particularly significant when there are wide gaps between the contact members or when the separations of these contact members are too remote from the clamping zone of the mould used for the coating operation, or else when the metal connections between the contact members are too thin and cannot be properly pressed by the resin against the mould bottom.

Whenever possible, a new design of the contacts will be provided for solving these difficulties, and if not, steps will be taken as shown in FIG. 3. In a first phase, resin buttons 17 are formed on the metal strip 19 in order to provide a mechanical connection between the contacts 10, and then the microchip 12 will be glued and wired, after cleaning the strip 19 wherever required. During the coating operation with the resin 14, this resin will fasten itself to the buttons 17 for forming the desired electronic module 1.

As can be seen from FIGS. 1-3, the metal strip 19, 119 is shaped so that cuts 16 have been made in this strip, the edge 18, 118 will be recessed, in respect of contact members 10, 110. In the case of FIG. 2, the strip 119 will have a bent edge 118 for this purpose. This shaping of the edges 13, 118 is useful, as will be explained hereinafter, for ensuring a good fastening of the module with the card.

The resin block 14 is designed with a beveled shape, so as to be wider near the contacts than on its end remote therefrom. Thus, as will be apparent from FIG. 1, the forces F exerted by the plastic material on this resin block 14 when filling the mould can be analysed as vertical forces F1 directed towards the contacts 10 and horizontal forces F2 directed towards the inside of the resin block. The horizontal forces F2 being all opposed, two by two, annul each other, while the vertical forces F1 tend to press the resin block 14 against the contact members 10 and to displace the module 1 towards the upper side of FIG. 1. The usefulness of this resultant force will be discussed hereinafter.

FIGS. 4 and 5 show in detail the shape given, in a first embodiment, to the resin block 14 and thus to the module 1. This shape is specially devised for allowing the method of this invention to be carried out effectively.

In this embodiment, the resin block 14 has a generally frusto-conical shape and presents, on its face opposed to its face carrying the contacts 10, a crenellated skirt 20. In the example shown, this skirt 20 is divided into four portions 21 by grooves 22. This skirt 20 presents openings 23 intended for positioning the module 1 inside the mould.

Figure 6:
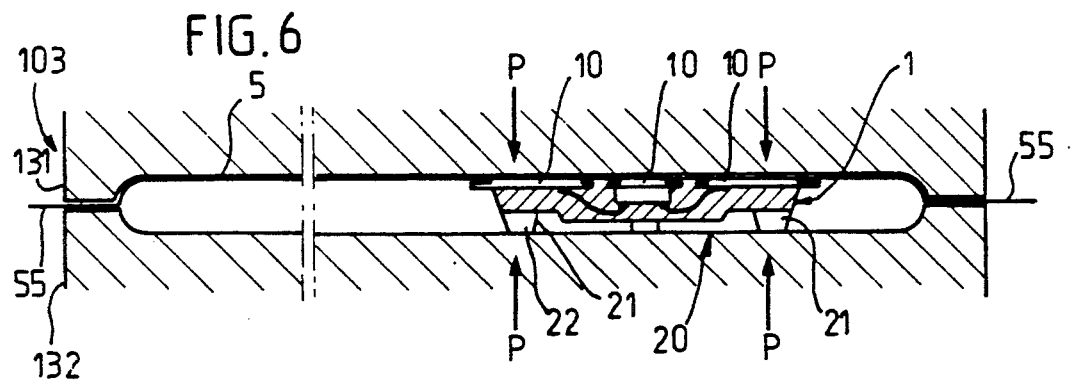
FIG. 6 is a cross-sectional view of a first installation for over-moulding.

In order to carry out the over-moulding operation over the module 1 for forming the desired chip card, the module is positioned, as shown in FIG. 6, inside a mould 103. The mould 103 in this first embodiment is formed, in a manner known per se, of two shells 131 and 132; one of the shells, in this case the lower shell 132, carries small lugs (not shown) over which the module 1 will be engaged. The module 1 engages the lugs with its apertures 23 until the end faces of portions 21 of the skirt 20 rest on the bottom of the shell 132, and then the upper shell 131 is positioned so as to close the mould.

This operation may advantageously be carried out using an appropriate tool which picks the modules placed on a transfer table, when use is made of a multiple mould. According to the invention, the module 1 is clamped between the shells of the mould 103 by applying a pressure P on this mould, as shown diagrammatically by the arrows P of FIG. 6, in the zone containing the module. For this purpose, the dimensions of the skirt 20 are such that, when the module 1 is in the mould 103, it contacts the upper shell 131 through its contact members 10 and it contacts the lower shell 132 through the ends of the skirt portions 21 which form preferential zones for the application of the pressure force. Thus, when pressure is applied, the module 1 is firmly clamped, which ensures an effective application of the contact pieces 10 against the internal face of the mould 103. This effect is further improved by the resultant of forces F1 directed towards the contact pieces, exerted by the plastic material on the resin block 14. As a result, during the injection of the plastic material, this material cannot displace the module 1, and it cannot seep in between the module and the upper shell, which would be liable to soil the contact members.

During the over-moulding operation, the grooves 22 dividing the skirt 20 provide passages for the plastic material being injected towards the lowermost zone of the skirt 20, so that it will fill said zone. The recessed edge 18, 18' being offset relatively to the plane of the contact members allows the plastic material to flow around the edges of the module 1 so as to ensure a perfect fastening of this module in the plastic card.

Figure 7:
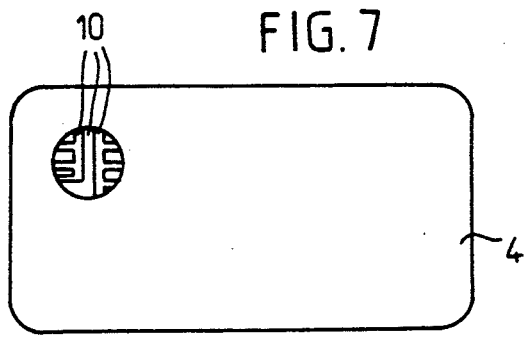
FIG. 7 is a view of the top face of a card obtained with the method according to the invention.
Figure 8:
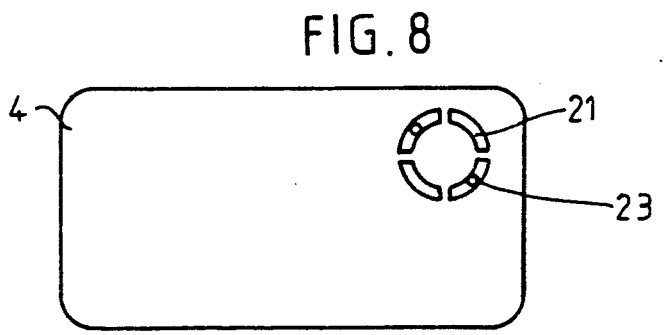
FIG. 8 is a view of the back face of this same card.
Figure 9:
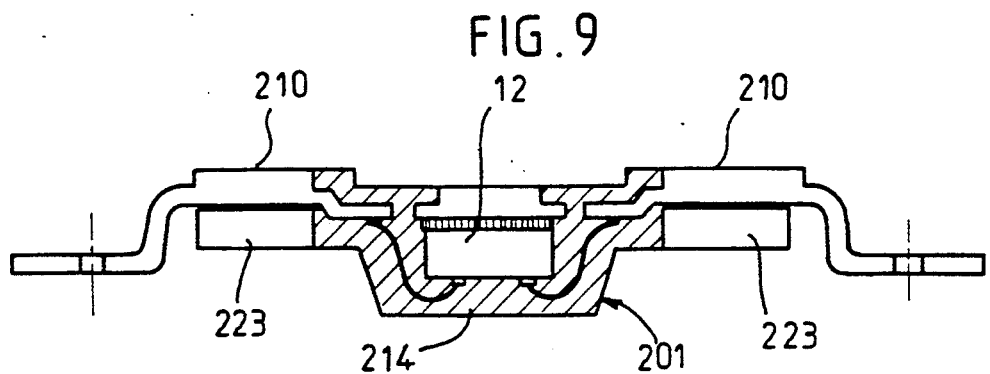
FIG. 9 is a cross-sectional view of a third embodiment of the central portion of the electronic module.
Figure 17A:
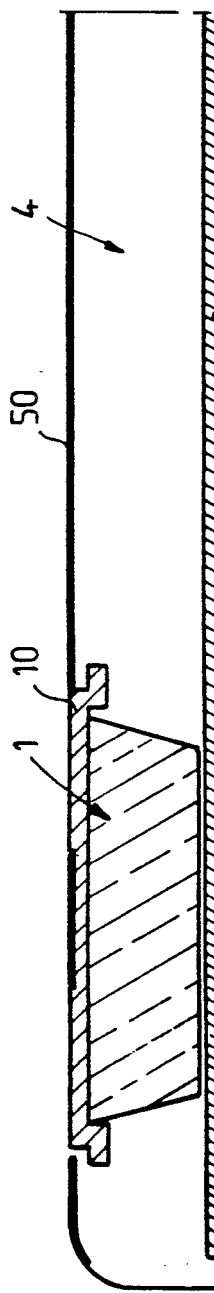
FIGS. 17a, 17b, 17c and 17d represent diagrammatically various designs of cards made by the method of this invention.
Figure 17B:
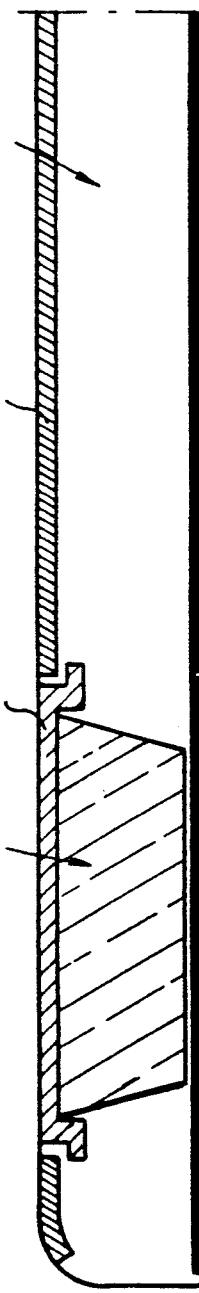
Figure 17C:
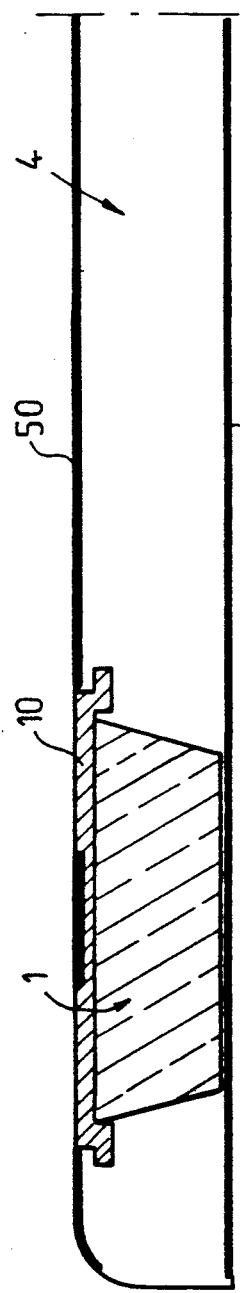
Figure 17D:
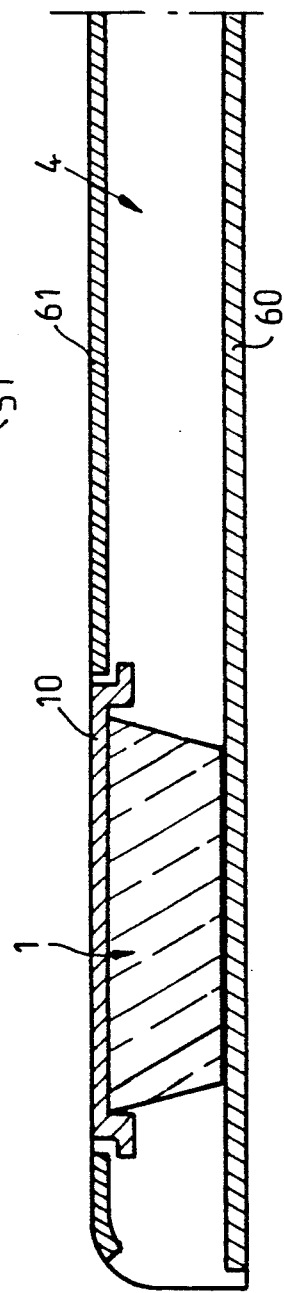

FIGS. 7 and 8 show the appearance of the front and back faces of the plastic card 4 obtained. It can be seen from FIG. 7 that the contacts 10 are visible on the front face of the card 4, so that they will be operational when the card is used. On the back face of the card 4, it is possible to see the end faces of the skirt portions 21, and also the centering apertures 23.

The module 1 shown in the drawings has a circular cross-section. It would obviously be possible to give it another cross-section, without departing from this invention. Also, it will be possible to adapt, at will, the shape, the number and the distribution of the apertures 23.

The card 4 may, if desired, be printed for serving as a support for advertising material or for useful data such as instructions for using the card. The present invention provides carrying out this printing operation at low cost, using the process known as the image-transfer method.

As apparent from FIG. 6, a film 5 is placed in at least one of the shells of the mould 103. This film carries on its face directed towards the inside of the mould the image which is to be transferred onto the card. The film 5 is provided with portions 55 which extend outside of the mould and which carry optical markings for positioning the film correctly. The transfer film may be designed with a colourless zone, in order to avoid printing the contacts.

It will also be possible to use a transfer film in which the image is adapted for adhering to the plastic material, but not to the metal parts. Thus, when the film is removed after the moulding operation, the image will cut itself out so as to match the outline of the contacts. This technique is advantageous when the shape of the module is such that portions of plastic material are disposed between the contacts, since it will then be easy to decorate these portions, thus improving the aesthetics of the card.

FIGS. 9-12 show a modified embodiment in which the electronic module 201 presents contacts 210 having the shape of rectangles disposed in columns. As shown in FIG. 11, such a module may for instance comprise two columns of four contacts each.

In this embodiment, the resin block 214 which protects the microchip 12 is provided with openings 223 positioned under each contact. The resin block 214 fills, as in the previous case, the free spaces (not visible in FIG. 9) between the contacts 210 in order to ensure the mechanical stability of the module 201.

The module 201 being thus fabricated is placed in a mould 203 inside which it is positioned by these openings 223 engaging small lugs 233 provided in the mould shell 232. The height of the lugs 233 which ensure the positioning of the module 201 is such that, when this module 201 is thus placed in the mould, the total height will be equal to the height of the mould cavity; thus, when the mould is closed, the contacts 210 are pressed against the internal face of the shell 231. It will then be possible by exerting, as shown in FIG. 6, a pressure P on the shells 231, 232, to clamp the module 201 in the mould for obtaining a card 204, the front face of which displays these contacts 210 (FIG. 11). The reverse face of the card 204 displays blind holes 224 in the bottom of which the underside of the contacts 210 is visible.

Development tests of the method such as described hereinabove have produced cards which were quite satisfactory, although they presented cavities in their back face. There will now be described, referring to FIGS. 13-16, two further embodiments of this invention capable of producing a chip card with perfect dimensions, as in the previous embodiment, but having this further advantage that it does not present cavities in its back face. According to these two new embodiments, the card is produced by using two successive injections.

FIGS. 13, 13a and 14 illustrate a third embodiment of the invention. FIG. 13 represents the mould 303 formed of an upper shell 331 and a lower shell 332 used in the first phase of the manufacturing process. The electronic module 301 is positioned in the lower shell 332 by means of lugs 333, with its contacts 310 directed towards the upper shell 331. These lugs 333 may have any suitable shape and disposition for preventing a rotation of the module 301, as they cooperate with the resin block 314.

It will for instance be possible to insert these lugs 333 into openings formed in the resin block 314. According to another embodiment, a resin block 314 is formed with a non-circular shape, for instance a polygonal shape, and the lugs 333 are then in the form of buttons disposed in registry with each face of the resin block, or else they may be replaced by a crown having an internal cross-section adapted to the shape of the resin block.

The free space inside the first mould always has a height less than the thickness of the card 304 which is to be produced. In order to carry out the printing of the microchip card simultaneously with the moulding operation, an image-transfer film 5 is positioned against the inside wall of the upper shell. The height of the lugs 333 is such that, when the module 301 is engaged with said lugs, the total height of this assembly will be equal to the free space inside the mould. When the film 5 and the module 301 are in place, the mould 303 is closed and a pressure, represented by the arrows F, is applied to the shells so that the module will be clamped in the mould during the injection. This pressure P is adjustable and is different from the pressure used for closing the mould. This clamping prevents the plastic material, which is injected at a pressure of about 700 kg/cm$^2$, to seep in between the contacts 310 and the upper shell 331 of the mould, which could soil the contacts and require a cleaning operation. This clamping insures also that the module will not be displaced by the plastic material and that it will remain perfectly positioned.

According to a modified embodiment shown in FIG. 13a, use is made of an insert 337 provided in the lower shell 332. This insert 337 forms a portion of the inner wall of the mould carrying the lugs 333. The pressure P is applied solely on this insert 337, which further improves the clamping of the electronic module 301. The portion of the mould located on the right side of FIG. 13a is not represented since, in a manner known per se in the art of moulding, the mould may have either a single imprint or several imprints for forming a cluster of cards.

During the moulding phase, a first part 341 of the chip card is produced. After the plastic material has hardened, the lower shell 332 is removed before a second mould is formed, using a second lower shell 334. Advantageously, the cycle may last for about 12 seconds. This second lower shell 334 is of such shape that the imprint of the second mould which if forms with the upper shell 331 matches the shape of the chip card 304 to be produced. A second image-transfer film 52 is placed against the inner wall of this second lower shell if it is required to print the face of the card 304 which does not carry the contacts.

After this, a second part 342 of the chip card is over-moulded on top of the first part 341. This second part 342 is such that it will fill the cavities left by the lugs 333.

At this stage, it is no longer required to apply a pressure on the shells, since the module is already positioned and held in place by the first card portion 341. The chip card 304 obtained after these two phases of moulding is perfectly flat over both its faces, and it contains an electronic module 301 which is accurately positioned.

This embodiment offers the advantage of obtaining cards 304 of even thickness, regardless of possible random variations in the dimensions of the module. This is due to the fact that the cavity of the second mould formed of the shells 331 and 334 has fixed dimensions and that during the injection, the plastic material which will form the second part 342 of the card fills in the empty spaces of the cavity, as it adapts to the dimensions of the module 301.

FIGS. 15, 16 and 16a represent a fourth embodiment of the invention. In this example, the portion 442 of the card 404 which does not contain the electronic module 401 is moulded during a first phase. As can be seen from FIG. 15, the upper shell 431 of the mould carries an insert 433 designed for forming positioning means for the module, such as a cavity 445 in the portion 442 of the card 404. This insert 433 and, therefore, the cavity 445 have a cross-section matching the cross-section of the resin block 414 encapsulating the module 401 to be placed in the card. Preferably, this resin block 414 will have a non-circular section. It would also obviously be possible to give the resin block 414 a circular cross-section but in this case cavities should be provided in the insert 433 for forming lugs in the above-said cavity 445, which makes the design of the mould more complicated.

The elements intended for marking the card are positioned against the inner wall of the lower shell 432. These elements may consist in image-transfer films, such as previously described but they may also consist in a label 60, as illustrated in FIG. 16a.

When producing a bank card which has to carry magnetic strips, these strips may be placed in advance on the label 60, using any known process such as lamination, printing or silk-screen printing. The label will be covered with a varnish adapted for being hot-glazed in the mould. Obviously, the box intended for the bearer's signature, as well as the hologram which is usually present on a bank card will either be placed on the card after the card has been manufactured, or else they may be provided on the label or on the transfer film used during the moulding process.

After the mould has been prepared, as described above, the first moulding phase will be carried out, in the manner illustrated diagrammatically in FIG. 15, for forming the first portion 442 of the card 404. After the plastic has set and hardened, the mould is opened and the upper shell 431 is removed. The electronic module 401 with tis encapsulating resin block 414 will then be placed in the cavity 445 formed in the first card portion 442 which has just been moulded. The contacts 410 are facing upwards, as shown in FIG. 16. The means for positioning the module 401, namely the cavity 445 in the first card portion 442, have a height such that the contacts 410 will be pressed against the wall of the mould 403 after this mould is closed with a second upper shell 435 inside which an image-transfer film 50 will have been positioned, if required.

As previously explained, a pressure P is exerted on the mould shells or otherwise, as shown in FIG. 16a, on an insert 437 for properly clamping the electronic module 401. The second phase of the moulding process is then carried out for over-moulding a second portion 441 of the card 404 over the first card portion 442.

It will be noticed that the imprint 472 left behind by the injection nozzle 473 will then become flush with the card surface, so that any desired position may be selected for this nozzle.

It is also obviously possible to provide, according to requirements, either labels 60, 61 or image-transfer films 50 51 on both faces of the card 4, as illustrated in FIGS. 17a-17d. It has also been illustrated diagrammatically, in FIGS. 17a and 17c how it is possible, when the transfer film 50 is provided on the card face displaying the contacts 10 of the electronic module, to print the unused central portion of these contacts, thus hiding the connections between the contacts. In this case, the labels will compulsorily need to be cut out so as to clear spaces for the contacts. These four patterns can be obtained, using just as well any of the above-described embodiments of the invention, it being sufficient to place either an image-transfer film or a label in the mould.

FIG. 18 shows a diagram of an installation for the manufacturing of microchip cards, using the method of this invention. It represents a mould with its upper and lower shells which can be moved in the direction of the arrows F for opening the mould. The card will then be moulded in the manner described in the foregoing, changing one of the shells when carrying out the third or the fourth embodiment. After this, using image-transfer films 50, 51, it will be possible, after retracting the shells, to pull the card or the cluster of cards having been moulded out of the mould 3.

The films are then removed, one after the other, by passing them over rollers 80, and the cards 4 are collected in a storage or transfer bin 8. When the cards are decorated with labels 60, 61, the same installation can be used, the cards being either picked directly out of the mould or pulled out by means of a film carrying these labels.

FIGS. 19a and 19b represent a detail of the moulds which facilitates the positioning of the image-transfer films when moulding a card through two successive phases. FIG. 19a shows a mould formed of shells 531, 532 for moulding the first portion of a card, namely here the top portion. In the mould shown here, two cards 545 and 546 are moulded simultaneously. The upper shell 531 of the mould will then present a boss 533 located between the various card imprints, and an injection nozzle 534 opens through this boss 533. This boss will then be used for positioning the image-transfer film 50 by means of an aperture 53 provided in said film. The film may also be positioned by means of the injection nozzle, as shown in FIG. 14.

During the first phase of the moulding process, the injection nozzle 534 is not in use, and the plastic material is injected through other nozzles (not shown) arranged in the shell 532, so that the transfer film 50 will be pressed by the plastic material against the wall of the shell 531.

On the contrary, the nozzle 534 will be used, as shown in FIG. 19b, during the second moulding phase, after the shell 532 has been replaced by a new shell 535. In the same manner as previously, the plastic being injected presses the film 51 against the wall of the shell 531 as the plastic is filling the mould. This arrangement may be used in either of the shells, as preferred.

It will obviously be possible to use, instead of the transfer films 50, 51, labels connected together by a carrier film, or labels provided with a tongue which will be positioned in the zone of the boss 533. This explanation applies to any known type of image support.

FIGS. 20 and 21 illustrate the moulding process for forming a card in a single injection phase, with a decorative element on each face of the card. FIG. 20 shows the mould formed of the shells 631 and 632, in which a card will be produced. One of the shells, here the upper shell 631, is provided with an injection nozzle 634 which opens through a boss 633 located outside the moulding cavity. The nozzle 634 opens opposite a channel 635 provided in the shell 632 for directing the injected plastic towards the cavity.

The transfer film 50 which needs to be pressed against the wall of the shell 631 presents, in the manner described in reference to FIG. 19a, an opening 53 by means of which it is positioned around the boss 633, while the other film 51 is positioned against the boss surface, in front of the outlet of the injection nozzle 634. The transfer films 50, 51 are held in place, as shown in FIG. 20 and in FIGS. 21a and 21c, by clamping them in the junction plane of the shells 631, 632 in the zones surrounding the boss which comprises the nozzle 634 and the channel 635.

FIG. 21c illustrates the injection of the plastic material. It can be seen that it is the plastic material which presses the film 51 into the bottom of the channel 635. Similarly, the plastic flowing towards the moulding cavity pushes apart the films 50 and 51, thus pressing them correctly against the mould walls as it gradually fills the cavity.

This procedure makes it possible to obtain a card according to this invention having good qualities of use as well as aesthetic qualities.

FIG. 21b shows an arrangement similar to that of FIG. 21a, in the case when the decorative elements are labels provided with tongues 662, 664 for holding them in place in the mould. In this case, the shells 631, 632 present recesses 636, 637 for receiving these tongues. The tongues 662, 664 are then held by being clamped against the face of the opposite shell, using a method similar to that used for the tranfer films 50, 51. The plastic material is injected between the tongues, thus pressing the tongue 664 against the wall of the channel 635 and pressing the labels against the walls of the mould cavity.

FIGS. 22a and 22b show the labels used in this procedure. FIG. 22a shows the upper label 660, which presents a tongue 662 having a generally rectangular shape, showing the opening 663 provided for positioning this tongue around the boss 633 of the shell 631. FIG. 22b shows the lower label 661 with its tongue 664.

The hatched zones denote the areas where will be applied the clamping force for keeping the labels in place in the mould during the moulding process.

In a manner known per se in moulding techniques, as shown diagrammatically in the drawings, there is provided between the two portions of the card a non-planar separation surface, in order to achieve a proper fastening of these portions to each other, and to optimize the filling ratio area vs. thickness of the mould for each of the injection operations, as a function of the position of the injection nozzles.

We claim:

1. A method for manufacture of a microchip card including an electronic module having external contacts, said module being positioned in a card of plastic material, comprising the steps:

providing an electronic module having a peripheral edge and a thickness defined between a front face and a rear face and having electrical contacts, each said contact having at least two surfaces with one of said surfaces of each contact being coplanar with said front face, an electronic microchip being wired and joined to said contacts, said joining being at another surface of said contacts, said microchip being encapsulated in plastic material to form said rear face, said microchip encapsulation leaving said coplanar contact surfaces exposed;

providing a mould with two shells, each shell having a respective cavity for producing a card by molding, said mould when closed having opposed faces of said cavities separated by at least the thickness of said electronic module, peripheral edges of said mould faces defining at least part of the general outline of said card;

positioning said electronic module at a predetermined position in the cavity of one shell of said mould with said one coplanar surface of each said contact is parallel abutment with the face of said one shell;

bringing said mould shells together;

applying pressure from opposite sides on said shells at locations corresponding to the position of said electronic module to press said face of said one shell against said coplanar contact surfaces;

injecting plastic to fill said mould and form a card and to simultaneously embed in said plastic said electronic module over its rear face and said peripheral edge, said abutting coplanar contact surfaces being kept free of plastic coating by said applied pressure;

cooling said molded card with said embedded module; and removing said card from said mould.

2. A manufacturing method according to claim 1 wherein the pressure P is applied to an insert (334, 437) of the mould.

3. A method as in claim 1, and further comprising the step:

placing at least one of a film and a label in at least one of said shells prior to the steps of closing said mould and injecting said plastic.

4. A method as in claim 1, wherein said electronic module is produced by the steps:

precutting and preforming a metal strip so as to provide said electronic module contacts with said coplanar surfaces;

joining and wiring an electronic microchip to said metal strip after said precutting and said preforming;

encapsulating said microchip with resin to provide said rear surface, leaving said coplanar contact surfaces exposed.

5. A method as in claim 1, and further comprising the step of forming said encapsulating plastic with a bevel shape, said bevel shape being wider near said contacts than on said rear surface, use being made of the pressure force of the injected plastic against the sides of the module for creating a force, the horizontal resultants of said force annulling each other, while the vertical resultant, having a positive value, contributes an exerting pressure for pressing the contacts of the module against the inner face of the mould shell.

6. A method according to claim 3 wherein said labels carry magnetic strips.

7. A method as in claim 3, wherein said film is an image transfer film which adheres to the injected plastic but does not adhere to said exposed planar contact surfaces, and further comprising the step:

removing said film from said contacts after removing said card from said mould.

8. A method as in claim 4, wherein said precutting and preforming includes the step of perforating said metal strip for ensuring that said encapsulating plastic material will cling firmly to said strip.

9. A method as in claim 4, and further comprising the step of recessing the edge of said metal strip, said recess being relative to said coplanar contact surfaces.

10. A method according to claim 9, wherein the edge (118) of said strip is bent for forming a recessed edge.

11. A method as in claim 4, and further comprising the step of forming small resin knobs on said metal strip before joining and wiring said electronic microchip.

12. A method as in claim 4, and further comprising the step of providing a crenellated skirt on said rear surface of said encapsulated microchip.

13. A method as in claim 12, and further comprising the step of providing apertures in said skirt.

14. A method according to claim 13, wherein the mould (103) being used presents lugs over which the module is engaged by its apertures until the end faces of the portions of the skirt (20) rest against the bottom of said mould.

15. A method as in claim 4, and further comprising the step of forming apertures in said encapsulated microchip, said apertures being positioned in opposition to said coplanar contact surfaces.

16. A method as in claim 15, and further comprising the step of providing engaging lugs in one of said mould shell, said lugs being positioned for engagement with said apertures.

17. A method as in claim 4, wherein said joining is by soldering.

18. A method as in claim 3, wherein one of a film and a label is placed in each said shell as an image support, said film and label each supporting a respective image, the image support in one said shell having an opening therethrough, a boss extended from one said shell and having a passage of an injection nozzle therethrough, further comprising the steps, prior to bringing said shells together, of:

positioning said image support opening in alignment with said injection nozzle for flow of plastic through said opening; and positioning the other said image support against the surface of said boss in front of an outlet of said injection nozzle, whereby injected plastic flows between said image supports, said image supports being forced apart and pressed by the injected plastic in opposite directions against the face of a respective shell.

19. A method for manufacture of a microchip card including an electronic module having external contacts, said module being positioned in a card of plastic material, comprising the steps:

providing an electronic module having a peripheral edge and a thickness defined between a front face and a rear face and having electrical contacts, each said contact having at least two surfaces with one of said surfaces of each contact being coplanar with said front face, an electronic microchip being wired and joined to said contacts, said joining being at another surface of said contacts, said microchip being encapsulated in plastic material to form said rear face, said microchip encapsulation leaving said coplanar contact surfaces exposed;

providing a mould with two shells, each shell having a respective cavity for producing a card by molding, said mould when closed having opposed faces of said cavities separated by at least the thickness of said electronic module, peripheral edges of said faces defining at least part of the general outline of said card;

positioning blocking means in one said mould shell;

shaping said encapsulating plastic material for cooperating with said blocking means, positioning said electronic module at a predetermined position in the cavity of the other shell of said mould with said one coplanar surface of each said contact in parallel abutment with the face of said other shell;

bringing said mould shells together;

applying pressure from opposite sides on said shells at locations corresponding to the position of said electronic module to press said face of said other shell against said coplanar contact surfaces;

injecting plastic to fill said mould and form a card and to embed simultaneously in said plastic said electronic module over its rear face and said peripheral edge, said abutting coplanar contact surfaces being kept free of plastic coating by said applied pressure;

cooling said molded card with said embedded module; and removing said card from said mould.

20. A method as in claim 19, wherein said blocking means and said electronic module have respective heights, when stacked together the total height equals the height of a mould cavity formed between said shell faces when said mould is closed.

21. A method according to claim 19 wherein the moulding process for producing the card is carried out in two successive phases, in order that the card will not present traces of the said positioning means.

22. A method according to claim 21, wherein the electronic module (301) is moulded over in the first portion (341) of the card while being positioned over lugs of the mould.

23. A method according to claim 22, wherein the second portion of the card is moulded over said first card portion, so that the cavities left behind by the lugs become filled with plastic.

24. A method according to claim 22 wherein the thickness of the card is governed by the depth of the cavity in the mould used for over-moulding the second card portion, so that this card thickness is independent of random variations in the dimensions of the module.

25. A manufacturing method according to claim 21, comprising the step of moulding a first card portion which includes means for positioning and blocking the electronic module.

26. A manufacturing method according to claim 25, comprising the step of moulding the second card portion over said first portion after inserting the electronic module into said positioning means.

27. A method as in claim 4, and further comprising the step of forming said encapsulating plastic with a bevel shape, said bevel shape being wider near said contacts than on said rear surface, use being made of the pressure force of the injected plastic against the sides of the module for creating a force, the horizontal resultants of said force annul each other, while the vertical resultant, having a positive value, contributes an exerting pressure for pressing the contacts of the module against the inner face of the mould shell.

28. A method as in claim 4, and further comprising the steps:
    positioning blocking means in one said mould shell;
    shaping said encapsulating plastic material for cooperating with said blocking means.

29. A method as in claim 28, wherein said blocking means and said electronic module have respective heights, when stacked together the total height equals the height of a mould cavity formed between said shell faces when said mould is closed.

30. A method as in claim 4, and further comprising the step of forming apertures, said apertures being positioned in opposition to said coplanar contact surfaces.

31. A method as in claim 4, wherein the moulding process for producing the card is carried out in two successive phases, in order than the card will not present traces of the said positioning means.

32. A method as in claim 23, wherein the thickness of the card is governed by the depth of the cavity in the mould used for over-moulding the second card portion, so that this card thickness is independent of random variations in the dimensions of the module.

* * * * *